(12) United States Patent  
Dumsong et al.

(10) Patent No.: US 11,784,102 B2  
(45) Date of Patent: Oct. 10, 2023

(54) HERMETIC SEMICONDUCTOR PACKAGES

(71) Applicant: UTAC Headquarters Pte. Ltd., Singapore (SG)

(72) Inventors: Eakkasit Dumsong, Bangkok (TH); Mike Jayson Candelario, Bangkok (TH); Phongsak Sawasdee, Bangkok (TH); Jiraphat Charoenratpratoom, Bangkok (TH); Paweena Phatto, Bangkok (TH); Maythichai Saithong, Bangkok (TH)

(73) Assignee: UTAC Headquarters Pte. Ltd., Singapore (SG)

( * ) Notice: Subject to any disclaimer, the term of this patent is extended or adjusted under 35 U.S.C. 154(b) by 60 days.

(21) Appl. No.: 17/389,294

(22) Filed: Jul. 29, 2021

(65) Prior Publication Data

US 2022/0037219 A1 Feb. 3, 2022

Related U.S. Application Data

(60) Provisional application No. 63/058,452, filed on Jul. 29, 2020.

(51) Int. Cl.
*H01L 23/053* (2006.01)
*H01L 21/52* (2006.01)
*H01L 23/00* (2006.01)

(52) U.S. Cl.
CPC ............ *H01L 23/053* (2013.01); *H01L 21/52* (2013.01); *H01L 23/564* (2013.01)

(58) Field of Classification Search
CPC ...... H01L 23/053; H01L 23/564; H01L 21/52
USPC .................................................. 257/668, 704
See application file for complete search history.

(56) References Cited

U.S. PATENT DOCUMENTS

| 5,311,402 | A | * | 5/1994 | Kobayashi | H01L 24/29 |
| | | | | | 174/17.05 |
| 5,532,514 | A | | 7/1996 | Kozono | |
| 5,956,576 | A | | 9/1999 | Toy et al. | |
| 6,627,987 | B1 | | 9/2003 | Glenn et al. | |
| 6,890,798 | B2 | | 5/2005 | McMahon | |
| 7,135,768 | B2 | | 11/2006 | Crane et al. | |
| 7,743,963 | B1 | | 6/2010 | Chung | |
| 7,948,069 | B2 | | 5/2011 | Zhuang | |
| 9,842,975 | B2 | | 12/2017 | Kim et al. | |
| 2015/0175406 | A1 | * | 6/2015 | Lin | B81B 7/007 |
| | | | | | 438/51 |
| 2016/0007486 | A1 | * | 1/2016 | Kim | H05K 5/0095 |
| | | | | | 361/752 |
| 2018/0240839 | A1 | * | 8/2018 | Egami | H01L 31/0203 |

* cited by examiner

*Primary Examiner* — Quoc D Hoang
(74) *Attorney, Agent, or Firm* — HORIZON IP PTE LTD.

(57) ABSTRACT

A semiconductor package and method for forming thereof are disclosed. The package includes a package substrate having a die cavity with a die attached therein. The package substrate also includes a cavity for bonding a cap thereto to form a hermetic package. The cap is bonded to the cavity using sealing rings.

23 Claims, 14 Drawing Sheets

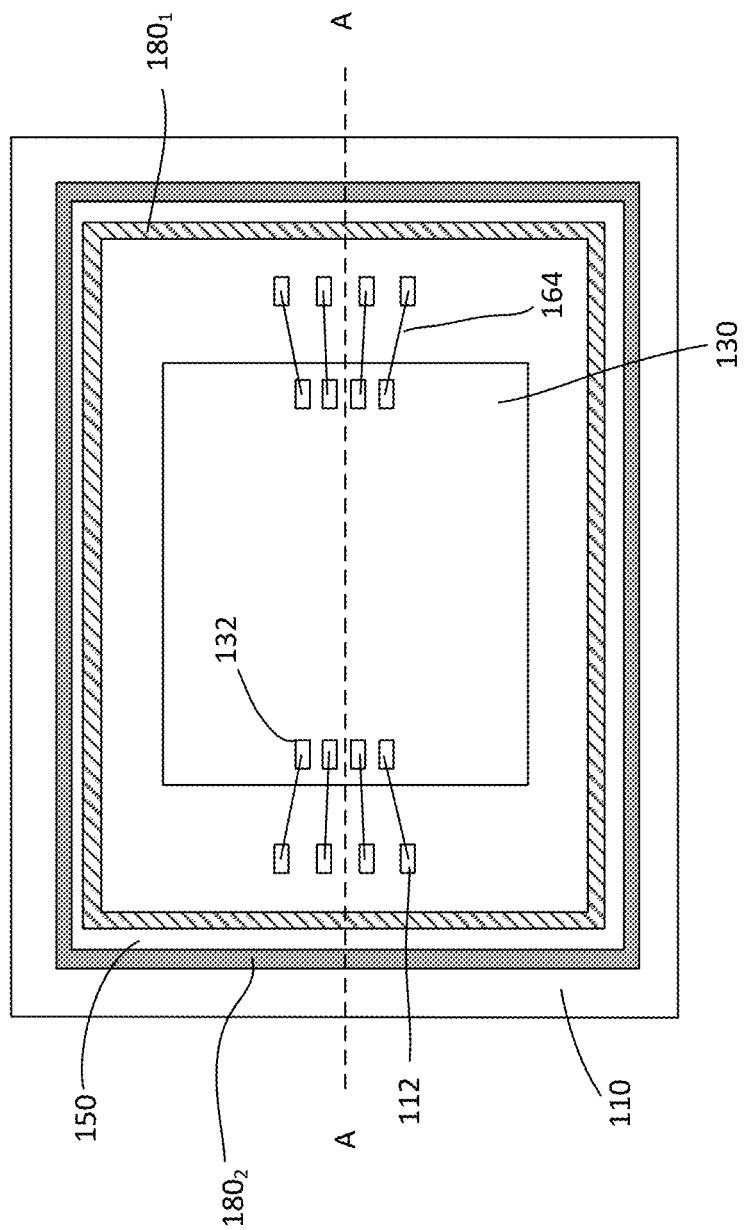
Fig. 1a₁

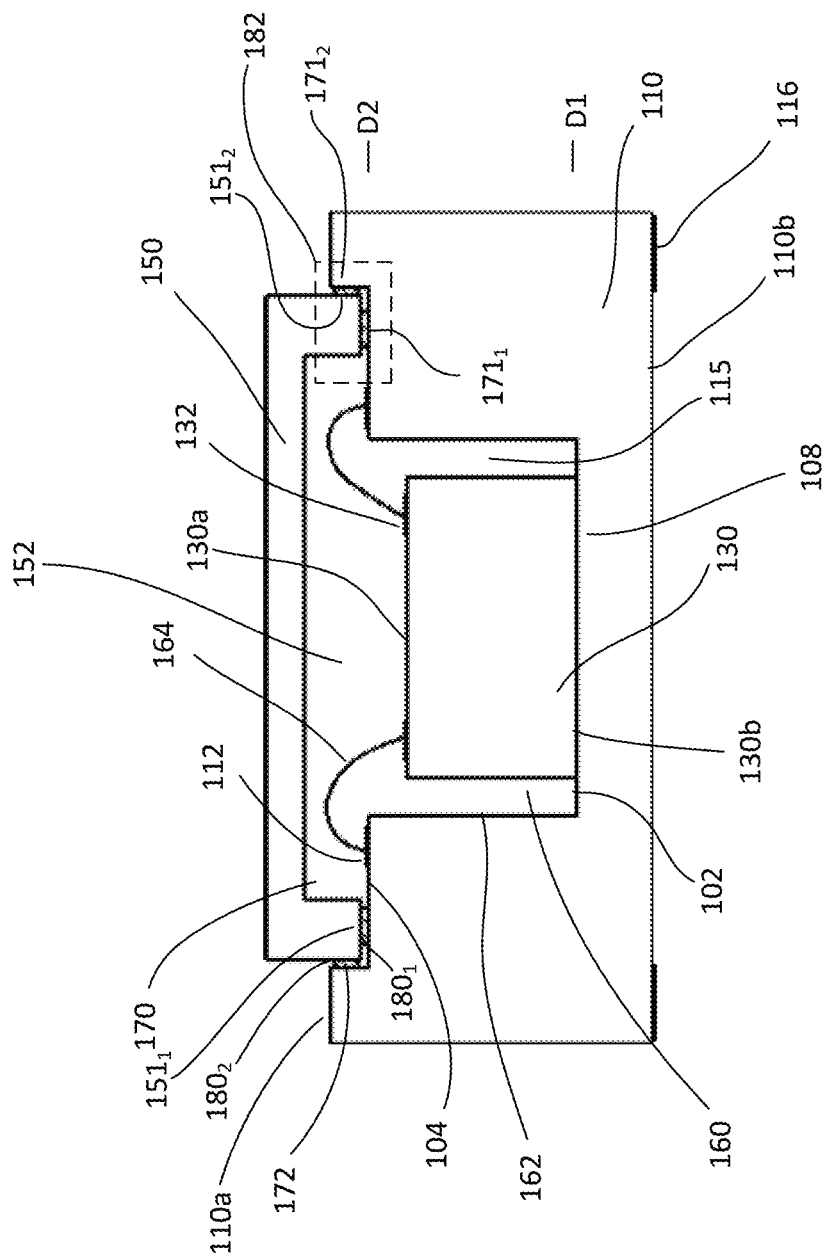
Fig. 1a₂

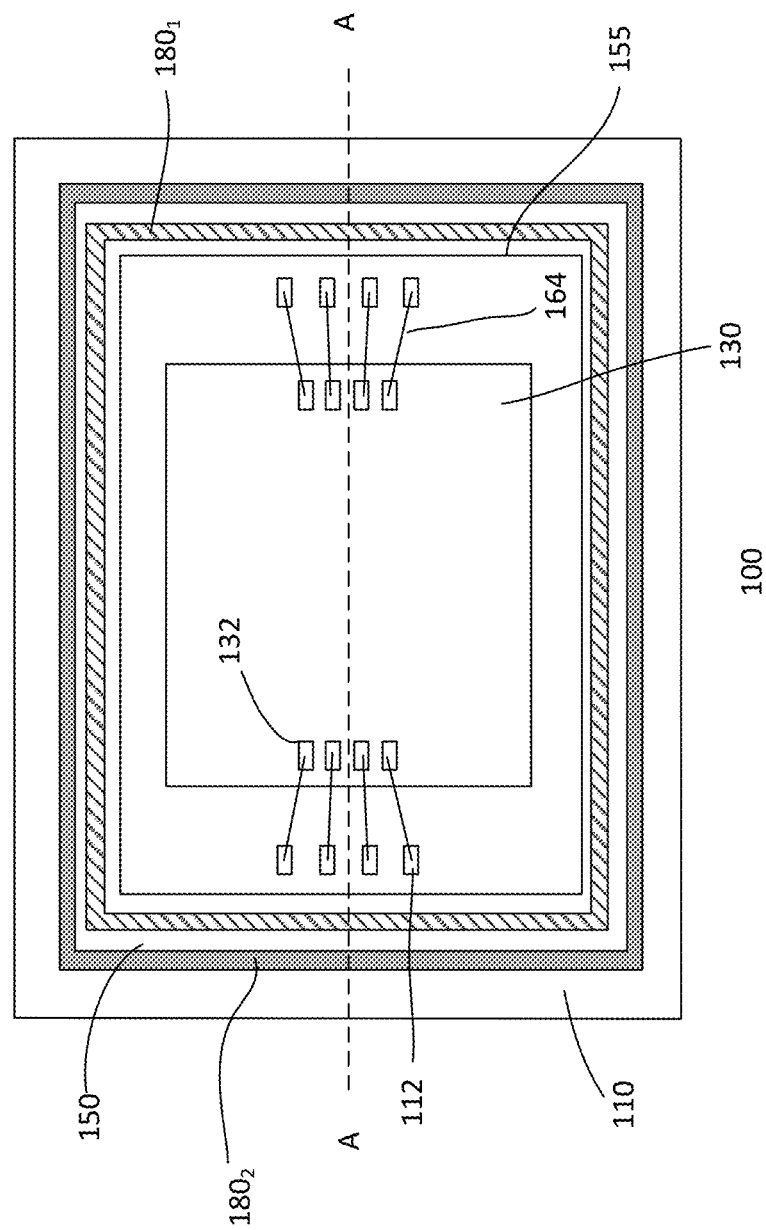
Fig. 1b₁

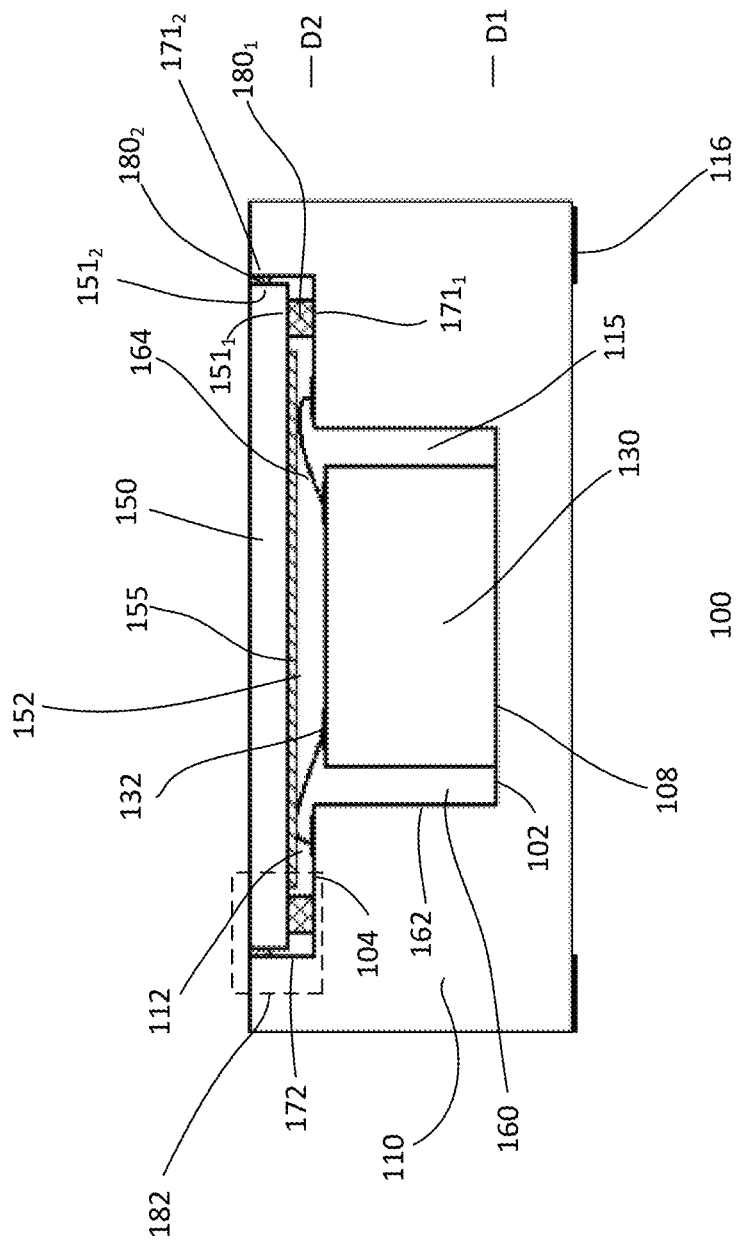
Fig. 1b₂

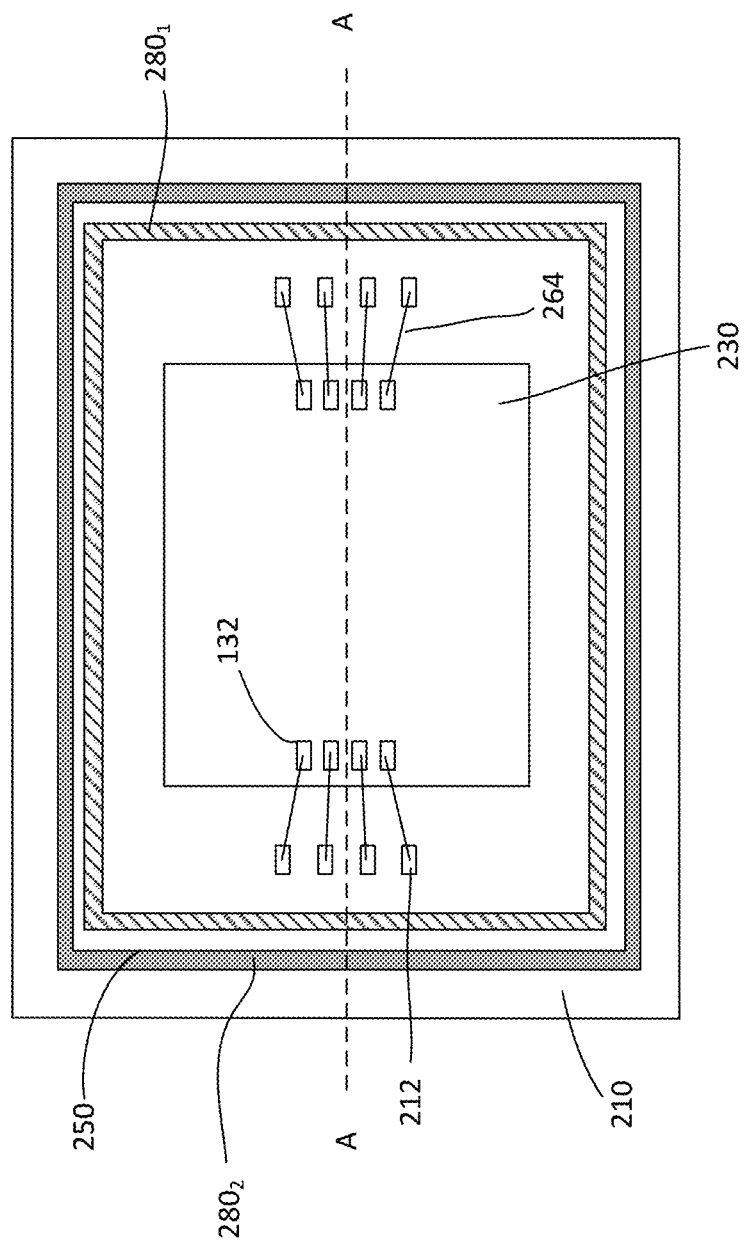
Fig. 2a₁

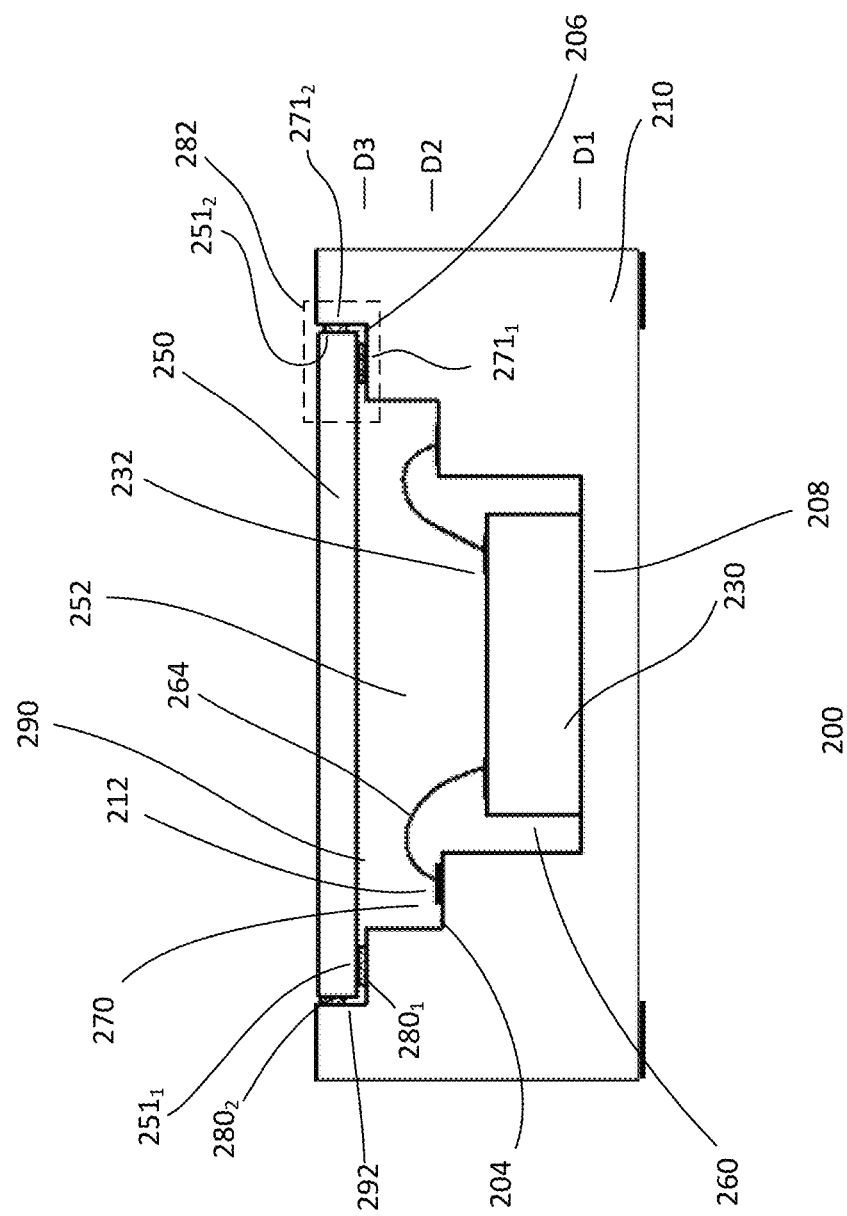
Fig. 2a₂

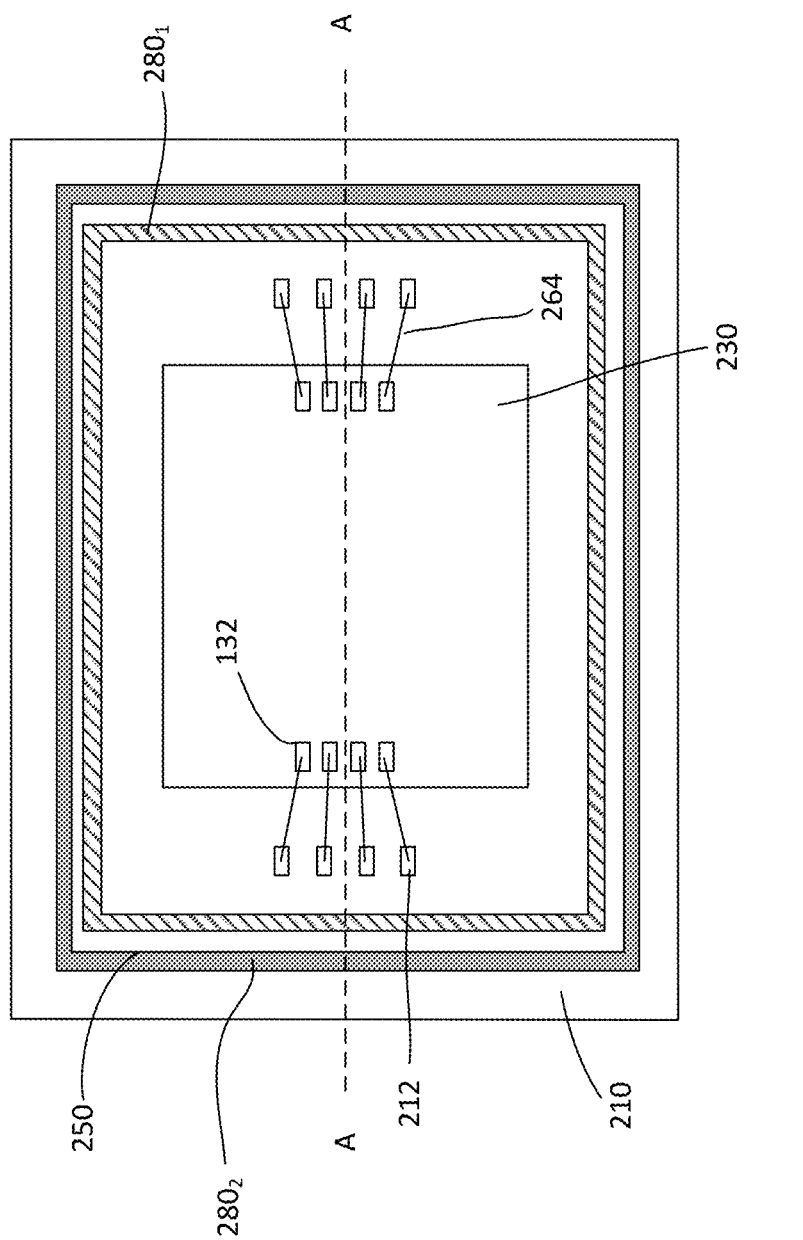
Fig. 2b1

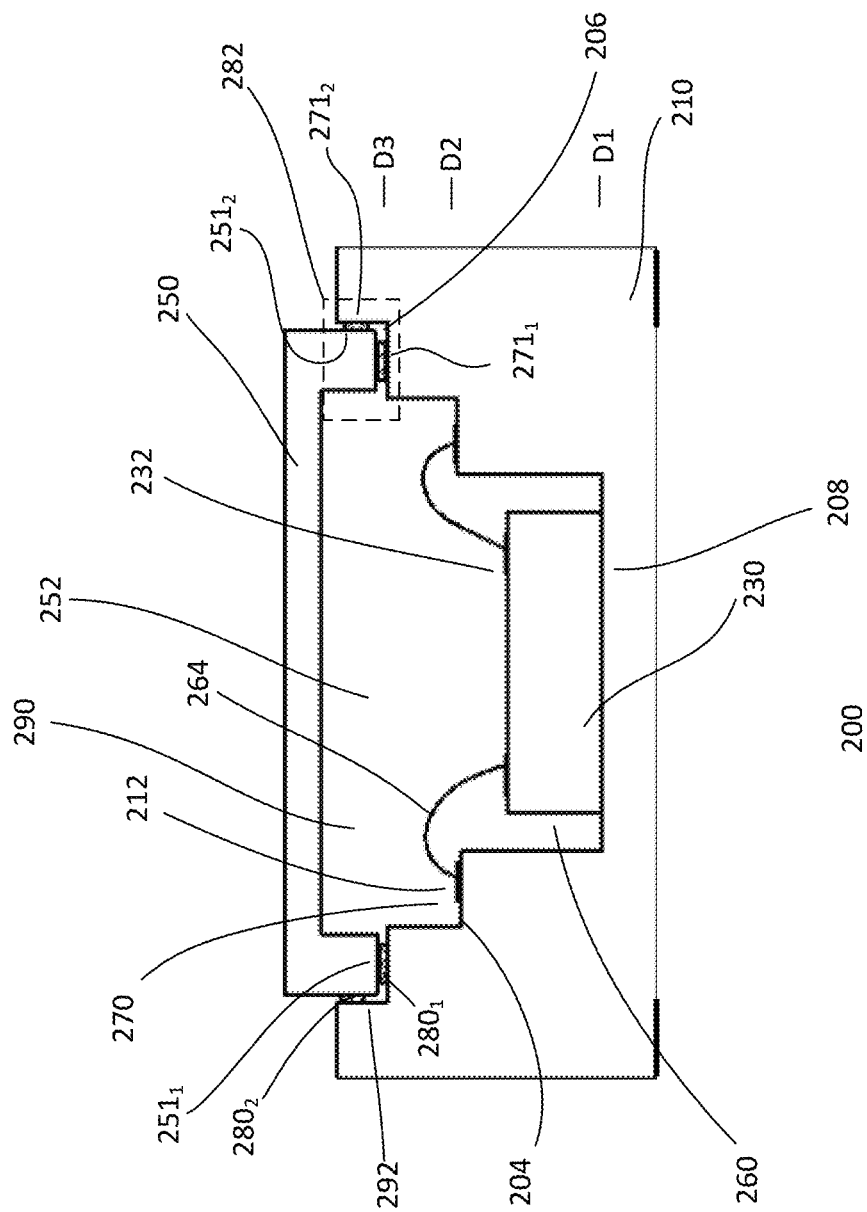
Fig. 2b₂

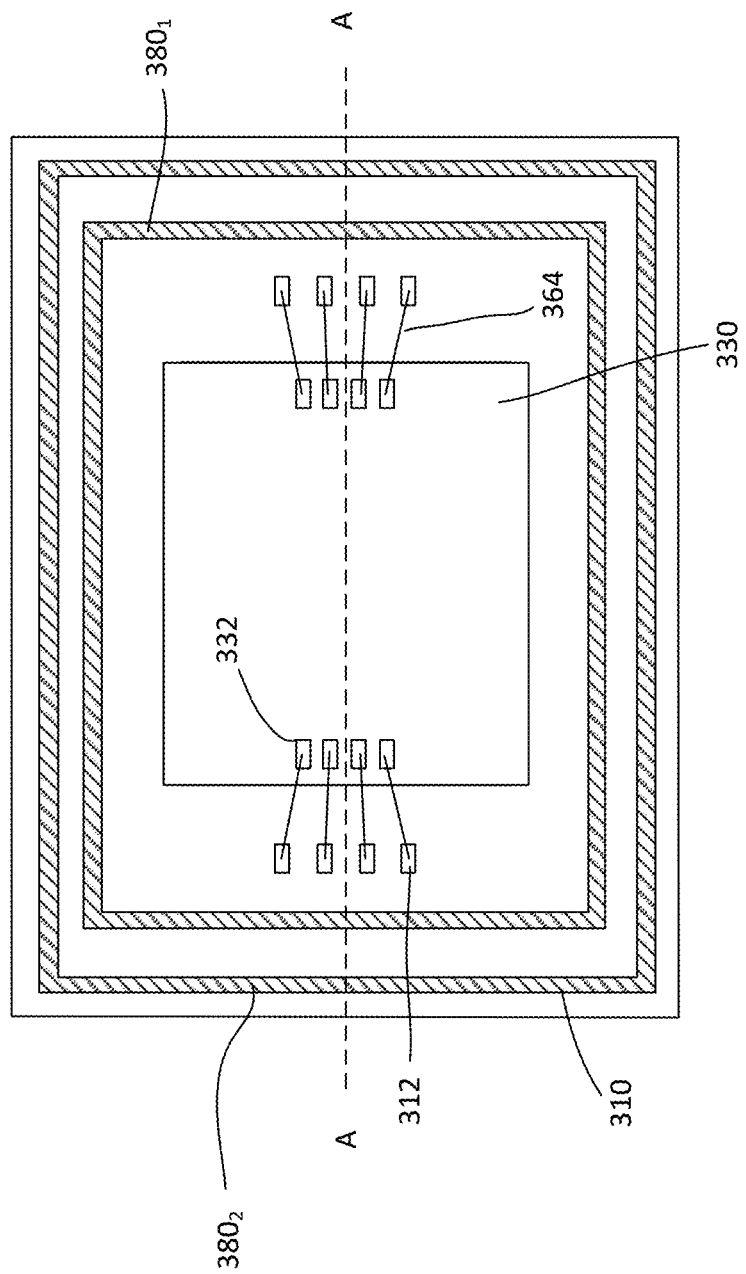
Fig. 3a₁

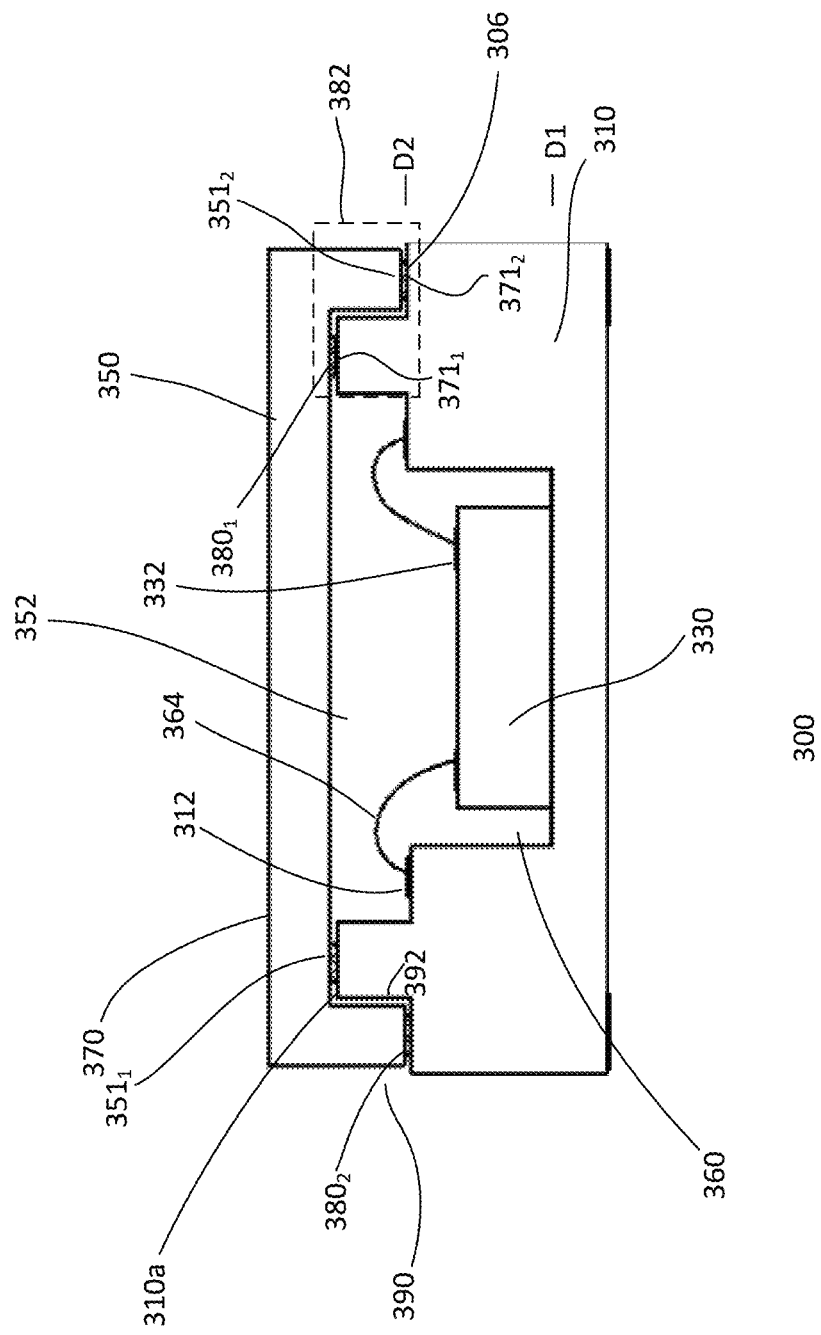
Fig. 3a₂

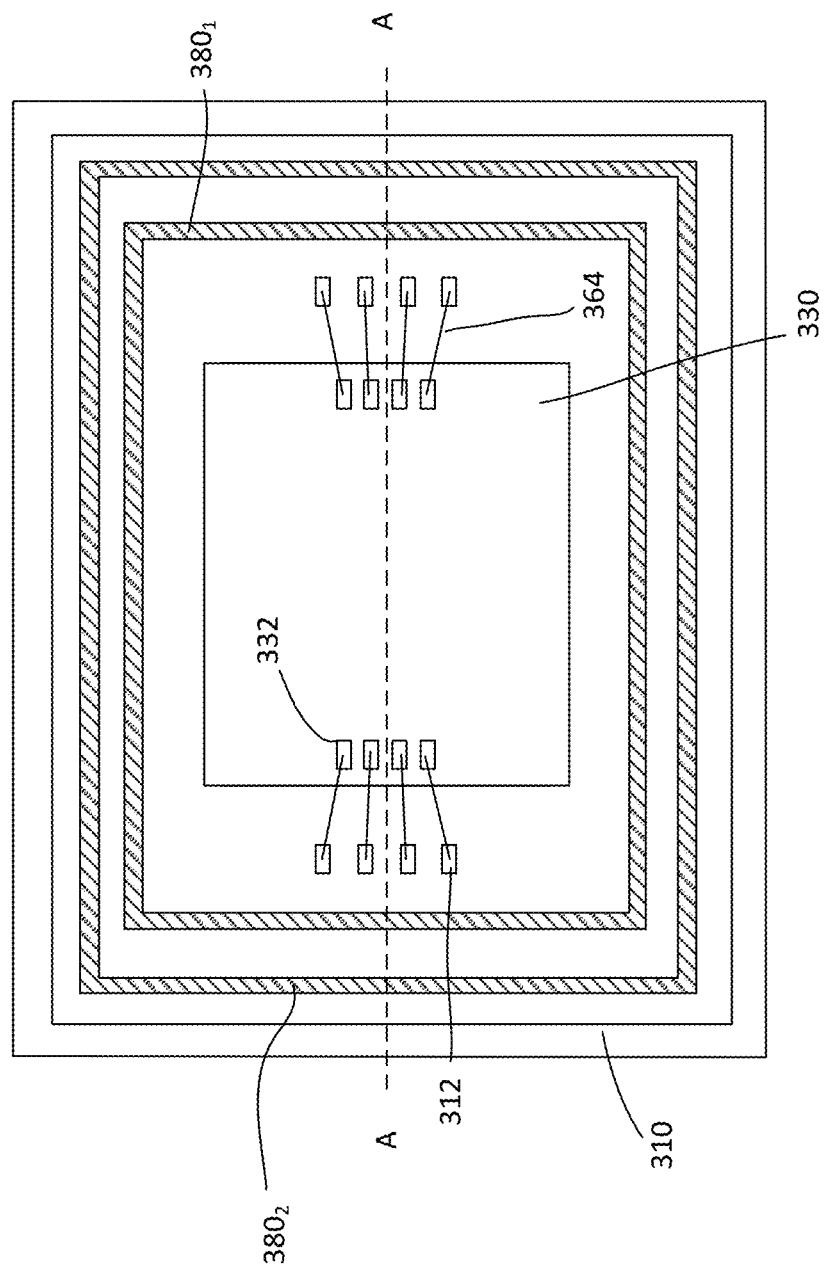
Fig. 3b₁

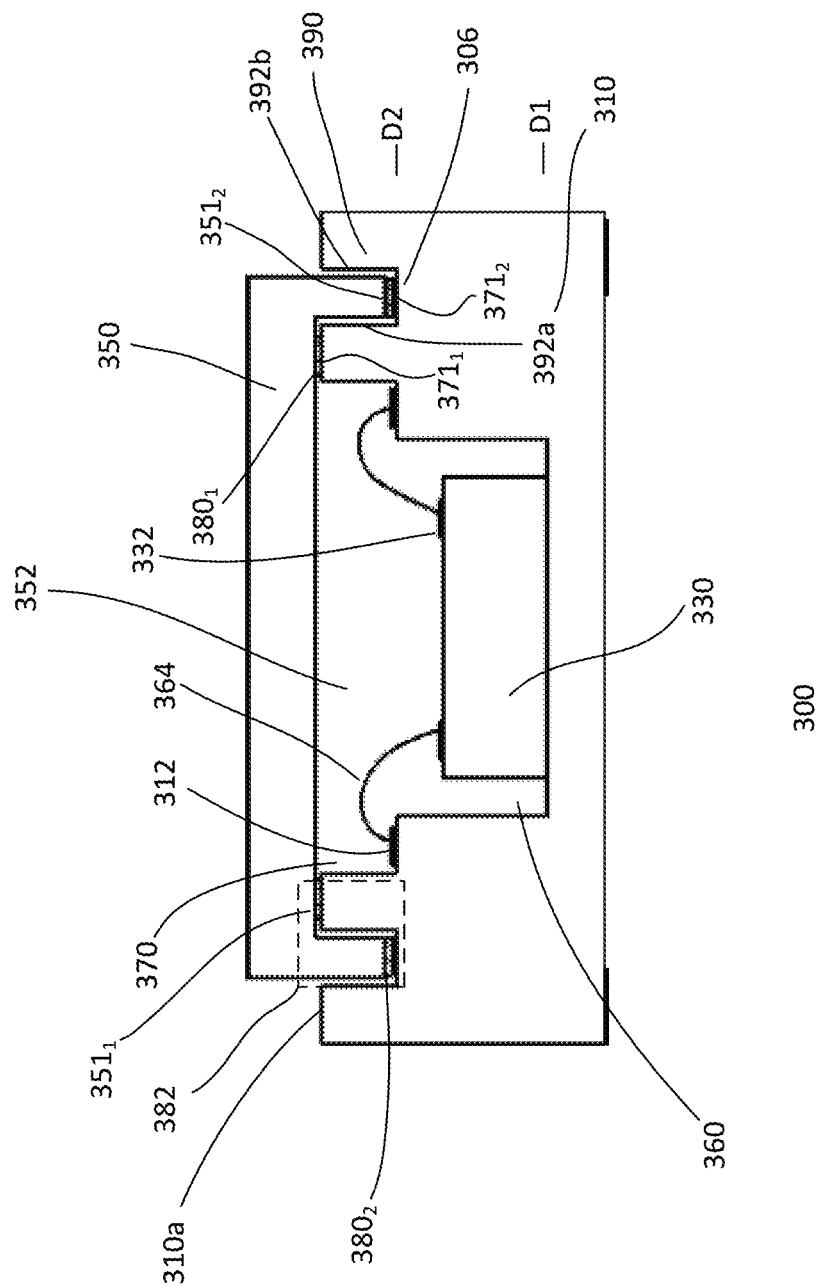
Fig. 3b₂

HERMETIC SEMICONDUCTOR PACKAGES

CROSS-REFERENCE TO RELATED APPLICATION

This application claims the benefit of U.S. Provisional Application No. 63/058,452, filed on Jul. 29, 2020, which is incorporated herein by reference in its entirety for all purposes.

FIELD OF THE INVENTION

The present disclosure relates to semiconductor packages and the manufacturing methods of such packages. In particular, the present disclosure relates to hermetic semiconductor packages. More specifically, the present disclosure relates to hermetic ceramic semiconductor packages.

BACKGROUND

Hermetic semiconductor packages are used to isolate microelectronic circuits, such as dies and chips, from the surrounding environment. An important aspect of hermetic semiconductor packages is the integrity of the seal between the cover to the package substrate to isolate the internal environment of the chip to the external environment. Inadequate sealing enables moisture or corrosive contaminates to damage components, such as wire bond connections. In the case where the internal environment is a vacuum or a pressurized environment, such as with inert gas, inadequate sealing compromises its integrity.

The present disclosure is directed to reliable sealing for hermetic semiconductor packages.

SUMMARY

Embodiments generally relate to semiconductor packages and methods for forming semiconductor packages.

In one embodiment, a method for forming a semiconductor package is disclosed. The method includes providing a package substrate having a top substrate surface and a bottom substrate surface. The package substrate includes a bottom cavity having a bottom cavity bottom surface and bottom cavity sidewalls and a top cavity disposed over the bottom cavity. The top cavity has a top cavity bottom surface at a top of the bottom cavity and top cavity sidewalls. The package substrate also includes a package bonding region. The package bonding region is a part of the top cavity. The package bonding region includes a first sealing region and a second sealing region. A first sealing ring is bonded to the first sealing region, and a second sealing ring is bonded to the second sealing region. The method further includes bonding a die to a die attach region on the bottom cavity bottom surface; and bonding a cap with a cap bonding region having a first cap sealing region and a second cap sealing region. The first and second sealing rings are bonded to the first and second cap sealing regions of the cap bonding region to hermetically seal the die in the bottom and top cavities.

In another embodiment, a semiconductor package is disclosed. The semiconductor package includes a package substrate having a top substrate surface and a bottom substrate surface. The package substrate includes a bottom cavity having a bottom cavity bottom surface and bottom cavity sidewalls and a top cavity disposed over the bottom cavity. The top cavity has a top cavity bottom surface at a top of the bottom cavity and top cavity sidewalls. The package substrate also includes a package bonding region. The package bonding region is a part of the top cavity. The package bonding region includes a first sealing region and a second sealing region. A first sealing ring is bonded to the first sealing region, and a second sealing ring is bonded to the second sealing region. The semiconductor package also includes a die attached to a die attach region on the bottom cavity bottom surface; and a cap with a cap bonding region having a first cap sealing region and a second cap sealing region. The first and second sealing rings are bonded to the first and second cap sealing regions of the cap bonding region to create a hermetically sealed cavity for the die.

In yet another embodiment, a package substrate for a package is disclosed. The package substrate includes a substrate body having a top substrate surface and a bottom substrate surface. The substrate body includes a bottom cavity having a bottom cavity bottom surface and bottom cavity sidewalls. The substrate body also includes a top cavity disposed over the bottom cavity. The top cavity has a top cavity bottom surface at a top of the bottom cavity and top cavity sidewalls. The substrate body also includes a package bonding region. The package bonding region is a part of the top cavity. The package bonding region includes a first sealing region and a second sealing region. A first sealing ring is bonded to the first sealing region, and a second sealing ring is bonded to the second sealing region. The first and second sealing rings are configured to bond a cap to the package substrate to create a hermetically sealed cavity for a die disposed in the bottom cavity.

These and other advantages and features of the embodiments herein disclosed, will become apparent through reference to the following description and the accompanying drawings. Furthermore, it is to be understood that the features of the various embodiments described herein are not mutually exclusive and can exist in various combinations and permutations.

BRIEF DESCRIPTION OF THE DRAWINGS

In the drawings, like reference characters generally refer to the same parts throughout the different views. Also, the drawings are not necessarily to scale, emphasis instead generally being placed upon illustrating the principles of various embodiments. In the following description, various embodiments of the present disclosure are described with reference to the following, in which:

FIGS. $1a_1$ to $1a_2$ and FIGS. $1b_1$ to $1b_2$ show simplified top and cross-sectional views of various embodiments of a semiconductor package;

Figure 4:
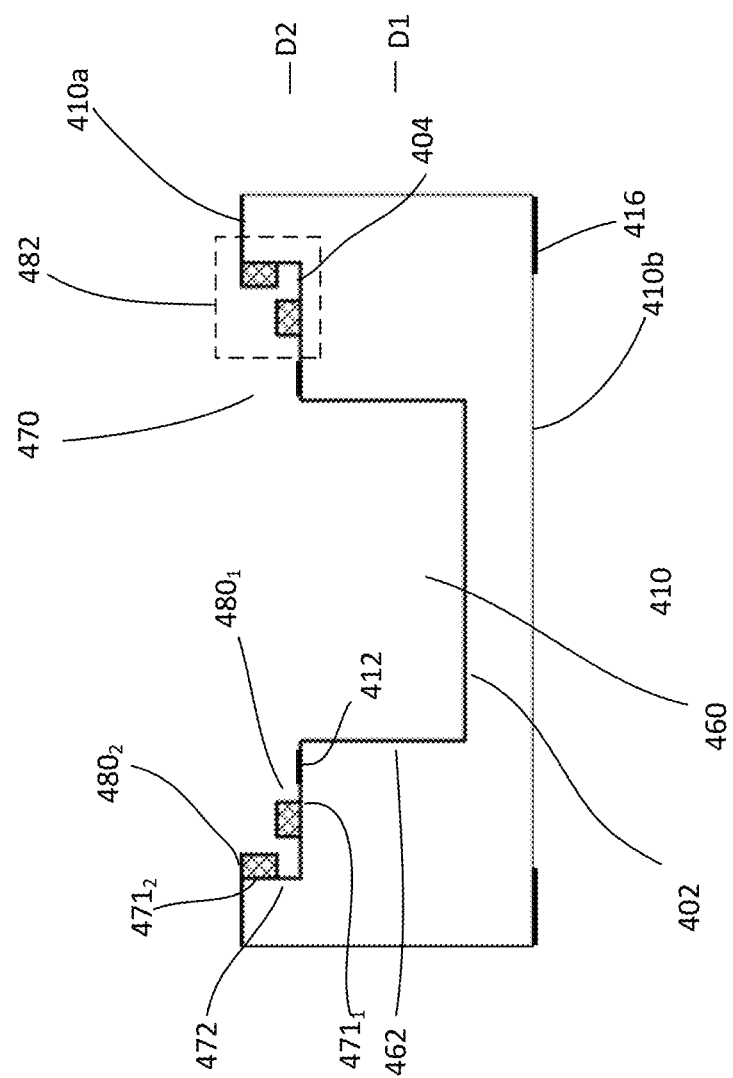
Figure 5:
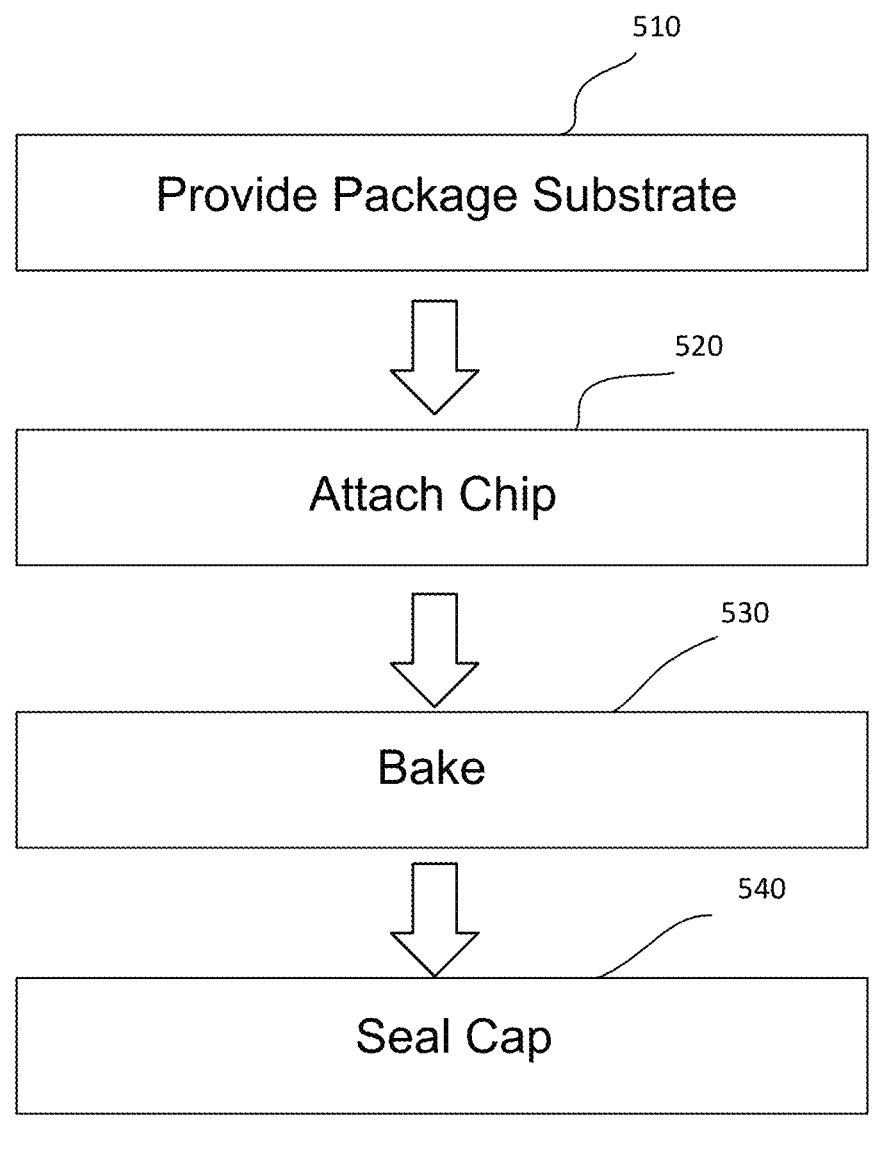

FIGS. $2a_1$ to $2a_2$ and FIGS. $2b_1$ to $2b_2$ show simplified top and cross-sectional views of other embodiments of a semiconductor package;

FIGS. $3a_1$ to $3a_2$ and FIGS. $3b_1$ to $3b_2$ show simplified top and cross-sectional views of yet other embodiments of a semiconductor package;

FIG. 4 shows a simplified cross-sectional of an embodiment of a package substrate; and FIG. 5 shows a process flow of forming various embodiments of a semiconductor package.

DETAILED DESCRIPTION

Embodiments described herein generally relate to semiconductor packages and methods for forming such semiconductor packages. In one embodiment, the semiconductor package is a hermetic semiconductor package. The package may be employed for automotive or non-automotive applications, including telecommunication as well as military and defense applications. The chips of the packages may be image sensors, LIDAR, inertial sensors, automotive timing devices, airbag ignitors, telecommunication timing devices, as well as other types of chips.

FIG. 1$a_1$ shows a top view of a semiconductor package 100 while FIG. 1$a_2$ shows a cross-sectional view of the semiconductor package 100 taken along A-A. The semiconductor package 100 includes a package substrate 110 having opposing first and second major surfaces 110a and 110b. The first major surface 110a may be referred to as the top package surface and the second major surface 110b may be referred to as the bottom package surface. Other designations for the surfaces may also be useful.

The package substrate 110, in one embodiment, is ceramic. The ceramic substrate may be a multilayer ceramic substrate. For example, the ceramic substrate is formed by multiple ceramic tape layers which are processed with metallization to create the package substrate or package body. The metallization, for example, may be tungsten (W), molybdenum (Mo), gold (Au), nickel (Ni) or an alloy thereof. Other types of metallizations may also be useful. The metallization, for example, may be formed by electrolytic or electroless plating. Other types of package substrates or techniques for forming the metallization may also be useful.

In one embodiment, the package body includes at least first and second cavities or cavity structures 160 and 170. As shown, the first cavity structure 160 is a bottom cavity structure and the second cavity structure 170 is a top cavity structure. Other arrangements or configurations of the cavity structures may also be useful. The first cavity structure includes a first cavity bottom surface 102 surrounded by the first cavity sidewalls 162, forming the bottom cavity structure. As for the second cavity structure, it includes a second cavity bottom surface 104 surrounded by second cavity sidewalls 172, forming the top cavity structure. As shown, the inner edge of the second cavity bottom surface abuts the first cavity sidewalls and forms a first or a bottom step profile. Likewise, the top package substrate surface 110a abuts the second cavity sidewalls, forming a second or a top step profile.

As shown, the first and second cavity structures are contiguous cavities. For example, the top cavity extends above the bottom cavity. The second cavity has a depth D2 from the top package substrate surface while the first cavity is disposed within the second cavity and has a depth D1 from the top package substrate surface. The footprint of the top cavity is larger than the footprint of the bottom cavity. Other configurations of the cavity structures may also be useful. The portion of the first cavity above D1 may be considered to be common with the second cavity.

As discussed, the cavities form a step profile. The sidewalls of the cavities are risers while the bottom surfaces of the cavities are treads of the step profile. The top package surface may also be considered a tread of the step profile. As shown, the treads are horizontal surfaces (parallel to the bottom surface of the package substrate) while the risers are vertical surfaces (perpendicular to the bottom surface of the package substrate). Other configurations of the profile of the cavities may also be useful.

The first cavity structure accommodates a die 130. The first cavity may be referred to as the die cavity. The size or footprint of the first cavity structure is larger than the footprint of the die to accommodate the die. The shape of the first cavity may be rectangular. Other shapes may also be useful. In one embodiment, the height of the first cavity is higher than the thickness of the die to fully accommodate the die. The attached die results in a gap 115 between the die sidewalls and the first cavity sidewalls. The first cavity bottom surface 102 includes a die attach region 108 on which the die 130 is attached. The die may be a sensor die. Other types of dies may also be useful. For example, the package may be used for any die which requires a hermetically sealed environment. Although as described, the first cavity accommodates one die, the first cavity may be designed to accommodate more than one die, either in a planar configuration, a stack configuration or a combination thereof.

The die includes opposing active and inactive surfaces 130a-b. In one embodiment, the inactive surface of the die is attached to the die attach region. A die adhesive (not shown) may be employed to attach the die to the die region. The adhesive may be a curable glue or adhesive tape. A curing process may be performed to permanently attach the die to the die region. Other types of die adhesives or techniques for attaching the die to the die region may also be useful.

The active surface of the die includes conductive die bond pads 132. The die bond pads or die pads enable external connections to the circuitry of the chip. The die pads may be disposed at a periphery of the die. As shown, the die pads are arranged as rows of die pads disposed at the periphery of opposing sides of the active surface of the die. Disposing the die pads at other portions of the active die surface or having other configurations or arrangements may also be useful. The die pads may be formed of, for example, copper (Cu), aluminum (Al), Gold (Au), Silver (Ag), nickel (Ni) or alloys thereof. Other types of conductive die pads may also be useful.

The package body includes package pads 112 and package contacts 116. The package pads and package contacts are metallized areas exposed on the surfaces of the package body. In one embodiment, the package pads 112 are disposed within the cavity of the package substrate and the package contacts 116 are disposed on the bottom surface 110b of the package substrate. For example, the package pads are internally exposed metallized regions of the package substrate and the package contacts are externally exposed metallized regions of the package substrate. Internally exposed metallized regions are exposed during packaging but are sealed after the packaging process while externally exposed metallized regions are exposed both during and after packaging process. In one embodiment, the package pads are disposed on the second cavity bottom surface 104. Providing the package pads on other surfaces of the cavity may also be useful. As for the package contacts, they may be disposed at the periphery or edges of the bottom package substrate surface 110b. The package pads 112 are coupled to the package contacts 116. The package pads, the package contacts and interconnections of the package pads and package contacts are formed by the metallization of the package substrate embedded into the package substrate during fabrication, as previously discussed.

In one embodiment, wire bonds 164 connect the die pads 132 to the package pads 112. Other techniques for connecting the die pads to the package pads may also be useful. By connecting the die pads to the package pads, the internal circuitry of the die can be accessed through the package contacts.

A cap 150 is bonded to the package substrate to hermetically seal the die within the cavities of the package structure. For example, bonding the cap to the package substrate forms a hermetically sealed package cavity 152.

In one embodiment, the cap is a metal cap. For example, the metal cap is formed of an alloy, such as iron-nickel-cobalt (Fe—Ni—Co) or know as Kovar®. Other types of metals or alloys may also be useful. The metal cap, as shown, includes a recess on an inner surface (surface facing the package substrate) thereof. The recess creates a cap with a cap cavity on the inner cap surface. In one embodiment, the cap includes a planar top member with a leg member surrounding the planar top member. The leg member forms the sides of the cap while the planar top member forms the top of the cap. The leg member and planar top member define the cap recess. For example, the recess is defined by the inner surfaces of the leg member and the planar top member. In one embodiment, the planar top member and leg member are formed of a single or unitary piece of material. The cap, for example, may be formed by a stamping process. Other techniques for forming the cap may also be useful. Other configurations of the cap with the recess may also be useful. For example, the cap may be a planar cap without a recess or the cap may include multiple recesses.

As shown, the second cavity is rectangular in shape, similar to the first cavity. For example, the first and second cavities are concentric rectangular-shaped cavities, with the second cavity being larger than the first cavity. The cap also is a rectangular-shaped cap tailored for bonding to the second cavity. For example, the top cavity accommodates the cap. In one embodiment, the cap is bonded to a package bonding region 182 which is part of the top cavity of the package substrate.

In one embodiment, multiple continuous cap sealing rings are provided in the package bonding region 182 for sealing the cap to the package substrate. In one embodiment, the cap is sealed to the package by at least first and second (two) continuous sealing rings $180_{1-2}$ in the package bonding region. Providing more than 2 sealing rings may also be useful. The multiple continuous sealing rings improve the hermetic sealing of the cavity in which the die is disposed. In one embodiment, the sealing rings are metal sealing rings. In one embodiment, the sealing rings are Fe—Ni—Co or Kovar® sealing rings. Other types of sealing rings may also be useful. It is understood that the sealing rings need not be formed of the same material. The sealing rings may be pre-formed by stamping, 3D printing or molding. Other techniques for forming the sealing rings may also be useful.

In one embodiment, a sealing ring is disposed or bonded on a package sealing region on the package substrate. For example, first and second package sealing regions $171_{1-2}$ are provided in the package bonding region 182 on the package substrate for the first and second sealing rings $180_{1-2}$. The first and second sealing rings on the first and second package sealing regions are mated or bonded to first and second cap sealing regions $151_{1-2}$ on the cap 150. For example, the cap sealing regions are disposed in a cap bonding region of the cap. In the case there are more than two sealing rings, additional package sealing regions and cap sealing regions are provided.

As shown, the first and second package sealing regions are located on abutting surfaces of the package substrate and the first and second cap sealing regions are located on abutting surfaces of the cap. In one embodiment, the first package sealing region $171_1$ is disposed on the second cavity bottom surface 104 and the second package sealing region $171_2$ is disposed on the second cavity sidewall 172; the first cap sealing region $151_1$ is disposed on the bottom surface of the leg member of the cap and the second cap sealing region $151_2$ is disposed on the outer surface of the leg member of the cap. For example, the package bonding region 182 includes the second cavity bottom surface and the second cavity sidewall while the cap bonding region includes the bottom and outer surfaces of the leg member. Other configurations of the package sealing regions and cap sealing regions may also be useful. For example, multiple package sealing regions may be disposed on the same package substrate surface and multiple cap sealing regions may be disposed on the same cap surface or the cap. In other cases, the multiple cap sealing regions may be disposed on non-abutting cap surfaces and the multiple package sealing regions may be disposed on non-abutting package substrate surfaces.

In one embodiment, the first and second package sealing regions are metallized regions on the package substrate. The metallized regions are metallization on the package substrate which are formed by plating during the formation of the package substrate. For example, electrolytic or electroless plating may be employed to form the metallized regions. In one embodiment, the metallized regions may be formed of tungsten (W), molybdenum (Mo), gold (Au), nickel (Ni) or alloys thereof. Other types of metals or techniques for forming the metal package sealing regions may also be useful.

In one embodiment, the first and second sealing rings are disposed on the metal package sealing regions on the package substrate. The width-to-thickness ratio of the sealing rings may be about 1:2. Other width-to-thickness ratios may also be useful. The actual widths and thicknesses may depend on, for example, the dimensions of the package sealing regions. The first and second sealing rings, in one embodiment, are bonded to the metal package sealing regions by brazing. For example, a flux is used to bond the metal sealing rings to the metal sealing regions. In one embodiment, the brazing flux is an Au—Cu alloy brazing flux. Other types of brazing fluxes may also be used to bond the sealing rings to the sealing regions. The sealing rings may be bonded to the respective package sealing region, one at a time. For example, a first sealing ring is mounted onto the first package sealing region and joined by brazing followed by mounting a second sealing ring mounted onto the second package sealing region and joined by brazing. Alternatively, the first and second sealing rings are mounted onto the first and second package sealing regions followed by a brazing process to join the sealing rings to the package sealing regions. Other techniques for bonding the sealing rings to the package sealing regions, such as soldering, may also be useful.

When the cap is fitted to the substrate, the cap bonding regions are mated to the sealing rings. As shown, the recess provides additional space or clearance for the bond wires. In some embodiments, a non-conductive layer is disposed on the inner surface of the cap. The non-conductive layer ensures that bond wires will not contact the metal cap, causing shorts or damaging the bond wires. The non-conductive layer may be a dispensible insulative layer, such as an epoxy, or an insulative tape applied to the inner surface of the cap. Other types of non-conductive layers or techniques for forming the non-conductive layer may also be useful.

Prior to bonding the cap to the package substrate, a baking process is performed to release gases and moisture out of the package. To permanently bond the cap to the package substrate, a seam sealing process is performed. The seam sealing process, for example, welds the sealing rings to the cap sealing regions, forming a hermetically sealed package cavity. In one embodiment, the seam sealing process includes applying current and voltage to weld the sealing rings to the cap sealing regions. This enables focusing the heat only on the sealing rings and cap sealing regions.

As described, the cap is bonded to the package substrate by multiple sealing rings. In one embodiment, the cap is bonded to the package substrate by first and second sealing rings. Bonding the cap using multiple sealing rings improves the sealing of the cavity, maintaining the integrity of the sealed environment of the die.

FIGS. $1b_1$ and $1b_2$ show top and cross-sectional views of another embodiment of a semiconductor package 100. The semiconductor package is similar to that described in FIGS. $1a_1$ to $1a_2$. Common elements may not be described or described in detail.

As shown, the package substrate 110 is a ceramic substrate having first and second cavities structures 160 and 170. The first and second cavities, for example, are contiguous cavities, with the second cavity being above the first cavity. A die 130 is attached to the package substrate within the first cavity. The die pads 132 of the die are connected to package pads 112 by bond wires 164.

In one embodiment, a cap 150 is bonded to the package substrate to hermetically seal the die within the cavities of the package structure. For example, bonding the cap to the package substrate forms a hermetically sealed package cavity 152. In other words, the cap along with the cavity structures of the package substrate forms the hermetically sealed package cavity.

In one embodiment, the cap is a metal cap. In one embodiment, the cap is a planar metal cap. For example, the cap does not include a recess. Multiple metal cap sealing rings are provided for sealing the cap to the package substrate. In one embodiment, the cap is sealed to the package by first and second continuous sealing rings $180_{1-2}$. Providing more than 2 sealing rings may also be useful.

In one embodiment, the first sealing ring $180_1$ bonds a first package sealing region $171_1$ of the package substrate 110 to a first cap sealing region $151_1$ of the cap 150; the second sealing ring $180_2$ bonds a second package sealing region $171_2$ of the package substrate to a second cap sealing region $151_2$ of the cap. As shown, the first package sealing region $171_1$ is disposed on the second cavity bottom surface 104 and the second package sealing region $171_2$ is disposed on the second cavity sidewall 172 while the first cap sealing region $151_1$ is disposed at the periphery of the bottom surface of the cap and the second cap sealing region $151_2$ is disposed at side surfaces of the cap.

As shown, since the cap does not include a recess, there is less clearance for the bond wires 164. To prevent potentially damaging the bond wires, a non-conductive protective layer 155 is disposed on the inner surface of the cap.

FIGS. $2a_1$ and $2a_2$ show yet another embodiment of a semiconductor package 200. The semiconductor package is similar to that described in FIGS. $1a_1$ to $1a_2$ and FIGS. $1b_1$ to $1b_2$. Common elements may not be described or described in detail.

As shown, the package substrate 210 is a ceramic substrate having first, second and third cavity structures 260, 270 and 290. The first, second and third cavities are contiguous cavities, with the third cavity being above the second cavity and the second cavity being above the first cavity. For example, the first cavity is the bottom cavity, the second cavity is an intermediate cavity and the third cavity is the top cavity. The cavities are concentric cavities that increase in size from the first cavity to the third cavity. The third cavity has a depth D3 from the top package surface, the second cavity has a depth D2 from the top package surface and the first cavity has a depth D1 from the top package surface.

A die 230 is attached to a die attach region 208 disposed within the first cavity. The die pads 232 of the die are connected to package pads 212 by bond wires 264. As shown, the package pads are disposed on a second cavity bottom surface 204. As shown, the height of the first cavity is sufficient to accommodate the die and the height of the second cavity is sufficient to accommodate the wire bonds.

In one embodiment, the cap 250 is bonded to the package substrate to hermetically seal the die within the cavities of the package structure. For example, bonding the cap to the package substrate forms a hermetically sealed package cavity 252. In other words, the cap along with the cavity structures of the package substrate forms the hermetically sealed package cavity.

In one embodiment, the cap is a planar metal cap, similar to that described in FIGS. $1b_1$ to $1b_2$. For example, the cap does not include a recess. The cap is bonded to the package bonding region 282. As shown, the package bonding region is part of the third or top cavity 290. Multiple metal cap sealing rings are provided for sealing the cap to the package substrate. In one embodiment, the cap is sealed to the package substrate by first and second continuous sealing rings $280_{1-2}$. Providing more than 2 sealing rings may also be useful.

In one embodiment, the first sealing ring $280_1$ bonds a first package sealing region $271_1$ of the package substrate 210 to a first cap sealing region $251_1$ of the cap 250; the second sealing ring $280_2$ bonds a second package sealing region $271_2$ of the package substrate to a second cap sealing region $251_2$ of the cap. As shown, the first package sealing region $271_1$ is disposed on the third cavity bottom surface 206 and the second package sealing region $271_2$ is disposed on the third cavity sidewall 292 while the first cap sealing region $251_1$ is disposed at the periphery of the bottom surface of the cap and the second cap sealing region is disposed at side surfaces of the cap.

Even though the cap does not include a recess, there is sufficient clearance for the bond wires 264 due to the height of the second cavity. As such, there is no need to provide a non-conductive protective layer on the inner surface of the cap to prevent damaging the wire bonds.

FIGS. $2b_1$ and $2b_2$ show an embodiment of a semiconductor package 200. The semiconductor package is similar to that described in FIGS. $1a_1$ to $1a_2$, FIGS. $1b_1$ to $1b_2$ and FIGS. $2a_1$ to $2a_2$. Common elements may not be described or described in detail.

As shown, the package substrate 210 is a ceramic substrate having first, second and third concentric contiguous cavity structures 260, 270 and 290. A die 230 is attached to a die attach region 208 disposed within the first cavity. The die pads 232 of the die are connected to package pads 212 by bond wires 264. As shown, the package pads are disposed on a second cavity bottom surface 204.

In one embodiment, a cap 250 is bonded to the package substrate to hermetically seal the die within the cavities of the package structure. For example, bonding the cap to the package substrate forms a hermetically sealed package cavity 252. In one embodiment, the cap is a metal cap with a recess on the inner cap surface, similar to that described in FIGS. $1a_1$ to $1a_2$. The cap includes a planar top member with a leg member surrounding the planar top member. The leg member forms the sides of the cap while the planar top member forms the top of the cap. The leg member and planar top member define the cap recess.

The cap is bonded to the package bonding region 282. As shown, the package bonding region is part of the third or top cavity 290. Multiple metal cap sealing rings are provided for sealing the cap to the package substrate. In one embodiment, the cap is sealed to the package substrate by first and second continuous sealing rings $280_{1-2}$. Providing more than 2 sealing rings may also be useful.

In one embodiment, the first sealing ring $280_1$ bonds a first package sealing region $271_1$ of the package substrate 210 to a first cap sealing region $251_1$ of the cap 250; the second sealing ring $280_2$ bonds a second package sealing region $271_2$ of the package substrate to a second cap sealing region $251_2$ of the cap. As shown, the first package sealing region $271_1$ is disposed on the third cavity bottom surface 206 and the second package sealing region $291_2$ is disposed on the third cavity sidewall 292 while the first cap sealing region $251_1$ is disposed on the bottom leg member surface of the cap and the second cap sealing region is disposed at outer side surfaces of the cap.

As shown, the leg member of the cap fits into the third cavity. Since the third cavity and leg member have the same height, there is sufficient clearance for wire bonds 264. As such, there is no need to provide a non-conductive protective layer on the inner surface of the cap.

FIGS. $3a_1$ and $3a_2$ show top and cross-sectional views of yet another embodiment of a semiconductor package 300. The semiconductor package is similar to that described in FIGS. $1a_1$ to $1a_2$, FIGS. $1b_1$ to $1b_2$, FIGS. $2a_1$ to $2a_2$, and FIGS. $2b_1$ to $2b_2$. Common elements may not be described or described in detail.

As shown, the package substrate 310 is a ceramic substrate having first and second concentric contiguous cavities structures 360 and 370. The first and second cavities form an internal step profile. The package substrate also includes a third cavity 390. The third cavity is an external cavity. In one embodiment, the third cavity is disposed on the top package surface 310a outside of the second cavity. For example, the third cavity is disposed between the second cavity and the outer package sidewalls of the package substrate. In one embodiment, the third cavity includes inner and outer third cavity sidewalls and a third cavity bottom surface. For example, the third cavity is created by a recess of the outer package surface from the top package surface 310a. The third cavity includes a third cavity sidewall 392 and a third cavity bottom surface 306. The third cavity is an external cavity and is distinct from the first and second internal cavities 360 and 370.

A die 330 is attached to the package substrate within the first cavity. The die pads 332 of the die are connected to package pads 312 by bond wires 364. The first cavity has a depth D1 while the second and third cavities both have the same depth D2. The height of the first cavity should be sufficient to accommodate the die and the height of the second cavity should be sufficient to accommodate the wire bonds 364.

In one embodiment, a cap 350 is bonded to the package substrate to hermetically seal the die within the cavities of the package structure. For example, bonding the cap to the package substrate forms a hermetically sealed package cavity 352. In one embodiment, the cap is a metal cap with a recess on the inner cap surface, similar to that described in FIGS. $1a_1$ to $1a_2$. The cap includes a planar top member with a leg member surrounding the planar top member. The leg member forms the sides of the cap while the planar top member forms the top of the cap. The leg member and planar top member define the cap recess.

The cap is bonded to a package bonding region 382 of the package substrate. The package bonding region is part of the third cavity and the top package surface 310a between the third cavity and the second cavity. In one embodiment, a first sealing ring $380_1$ bonds a first package sealing region $371_1$ of the package substrate 310 to a first cap sealing region $351_1$ of the cap 350; the second sealing ring $380_2$ bonds a second package sealing region $371_2$ of the package substrate to a second cap sealing region $351_2$ of the cap. As shown, the first package sealing region $371_1$ is disposed on the top package surface 310a between the second and third cavities and the second package sealing region $371_2$ is disposed on the third cavity bottom surface 306. The first cap sealing region $351_1$ is disposed at the periphery of the inner surface of the cap adjacent or close to the leg member and the second cap sealing region $351_2$ is disposed at the bottom leg member surface of the cap.

In some embodiments, a third sealing ring (not shown) may be provided. The third sealing ring may be provided to bond the inner leg member surface to the third cavity sidewall 392.

As shown, the leg member of the cap fits into the third cavity. Since the third cavity and second cavity have the same height, there is sufficient clearance for wire bonds 364. As such, there is no need to provide a non-conductive protective layer on the inner surface of the cap.

FIGS. $3b_1$ and $3b_2$ show top and cross-sectional views of yet another embodiment of a semiconductor package 300. The semiconductor package is similar to that described in FIGS. $3a_1$ to $3a_2$. However, unlike FIGS. $3a_1$ to $3a_2$, the third cavity 390 is an external cavity defined between inner and outer third cavity sidewalls 392a-b. As such, the inner third cavity sidewall 392a abuts the inner surface of the leg member of the cap 350, while the outer third cavity sidewall 392b abuts the outer surface of the leg member of the cap 350.

FIG. 4 shows a cross-sectional view of an embodiment of a package substrate 410. The package substrate is similar to the package substrate described in FIGS. $1a_1$ to $1a_2$ and FIGS. $1b_1$ to $1b_2$. Common elements may not be described or described in detail.

The package substrate is a ceramic package substrate with top and bottom substrate surfaces 410a and 410b. The ceramic package substrate includes a cavity package body. In one embodiment, the package body includes a bottom cavity 460 and a top cavity 470. The cavities are rectangular-shaped concentric cavities, with the top cavity having a larger dimension than the bottom cavity. The bottom cavity includes a bottom cavity bottom surface 402 and bottom cavity sidewalls 472; the top cavity includes a top cavity bottom surface 404 and top cavity sidewalls 472. The concentric cavities form a step-shaped profile. For example, the sidewalls serve as risers and bottom surfaces serve as treads of the step-shaped profile.

The bottom cavity has a depth D1 from the top package surface 410a and the top cavity has a depth D2 from the top package surface. The height of the bottom cavity (D1-D2) should be sufficient to accommodate a die in a die attach region on the bottom cavity bottom surface 402. As for the top cavity, it should have a height (top package substrate surface–D2) to accommodate wire bonds bonded to package pads 412 on the top cavity bottom surface 404. The height may depend on whether a cap with a recess or a planar cap is employed to seal the package substrate.

Package contacts 416 are disposed on the bottom package surface 410b. The package contacts on the bottom package surface are connected to the package pads 412 by metallization during the formation of the package substrate. In one embodiment, the package contacts, package pads and interconnections of the package pads and the package contacts are formed by the metallization of the package substrate embedded into the package substrate during fabrication of the package substrate. The metallization, for example, may be tungsten (W), molybdenum (Mo), gold (Au), nickel (Ni) or an alloy thereof. The metallization, for example, may be formed by electrolytic or electroless plating. Other types of or techniques for forming the metallization may also be useful.

In one embodiment, the package substrate includes a package bonding region 482. The package bonding region is a region of the package substrate to which a cap is bonded. In one embodiment, the package bonding region is part of an upper portion of the package substrate. For example, the package bonding region is part of the top cavity 470.

In one embodiment, multiple continuous cap sealing rings are provided in the package bonding region 482 for sealing the cap to the package substrate. In one embodiment, the cap is sealed to the package by at least first and second (two) continuous sealing rings $480_{1-2}$ in the package bonding region. Providing more than 2 sealing rings may also be useful. The multiple continuous sealing rings improve the hermetic sealing of the cavity in which the die is disposed. The sealing rings, in one embodiment, are metal sealing rings. In one embodiment, the sealing rings are Fe—Ni—Co or Kovar® sealing rings. Other types of sealing rings may also be useful. Although preferably the sealing rings are formed of the same material, it is understood that it is not necessary. The sealing rings may be pre-formed by stamping, 3D printing or molding. Other techniques for forming the sealing rings may also be useful.

In one embodiment, a sealing ring is disposed or bonded on a package sealing region on the package substrate. For example, first and second package sealing regions $482_{1-2}$ are provided in the package bonding region 482 on the package substrate for the first and second sealing rings $480_{1-2}$. As shown, the first and second package sealing regions are located on abutting surfaces of the package substrate in the package bonding region. In one embodiment, the package bonding region is part of the top cavity 470. In one embodiment, the first package sealing region $471_1$ is disposed on the top cavity bottom surface 404 and the second package sealing region $471_2$ is disposed on the top cavity sidewalls 472.

In one embodiment, the first and second sealing regions are metallized sealing regions. The metallized sealing regions are metallization on the package substrate which are formed by plating during the formation of the package substrate. For example, electrolytic or electroless plating may be employed to form the metallized sealing regions. In one embodiment, the metallized sealing regions may be formed of tungsten (W), molybdenum (Mo), gold (Au), nickel (Ni) or alloys thereof. Other types of metals or techniques for forming the metal sealing regions may also be useful.

The first and second sealing rings are bonded to the first and second sealing regions by brazing. Other techniques for bonding the sealing rings to the sealing regions may also be useful. In one embodiment, the sealing rings are brazed to the sealing regions one at a time. For example, the first or the second sealing ring is bonded the first or second sealing region by brazing followed by bonding the other sealing ring to the other sealing region by brazing. In other embodiments, the sealing rings are bonded to the sealing regions in a single brazing process.

FIG. 5 shows a package process flow 500 of forming various embodiments of a semiconductor package. The semiconductor package is, for example, the same or similar to those described in FIGS. $1a_1$ to $1a_2$, FIGS. $1b_1$ to $1b_2$, FIGS. $2a_1$ to $2a_2$, FIGS. $2b_1$ to $2b_2$, FIGS. $3a_1$ to $3a_2$, and FIGS. $3b_1$ to $3b_2$. Common elements may not be described or described in detail.

The process flow, for example, commences at 510. The process flow may be at a stage of processing where dies are formed on a wafer and diced or sawed to singulate the wafer into individual dies. The wafer may be backgrinded to thin the wafer prior to dicing. After the wafer is singulated into individual dies, the dies are inspected. Inspected dies passing inspection are used to form packages. As for the package substrates, they are provided, for example, by a package substrate supplier. The package substrates may be formed on a package substrate strip and singulated into individual package substrates. Caps may be formed on a cap strip by, for example, stamping and singulated into individual caps. The dies, package substrates and caps are provided for the packaging process.

At 510 a package substrate is provided. The package substrate is a ceramic package substrate with at least bottom and top concentric cavities, such as those previously described. In some embodiments, the package substrate may also include one or more intermediate cavities, for example, as described in FIGS. $2a_1$ to $2a_2$ and FIGS. $2b_1$ to $2b_2$. The bottom, intermediate, and top cavities may be referred to as internal cavities. In other embodiments, the package substrate may include an external cavity which is distinct from the internal cavities, for example, as described in FIGS. $3a_1$ to $3a_2$ and FIGS. $3b_1$ to $3b_2$. Other configurations of the cavities of the package substrate may also be useful.

The package substrate includes package contacts and package pads. The package pads are disposed within the internal cavities of the package substrate; the package contacts are disposed on a bottom package substrate surface. The package pads are electrically coupled to the package contacts by internal package substrate interconnections. The package pads, the package contacts and package interconnections are formed by the metallization embedded into the package substrate during fabrication. The package pads may be disposed on a top cavity bottom surface or an intermediate cavity bottom surface, depending on the configuration of the package substrate.

In one embodiment, the package substrate includes a package bonding region. The package bonding region is a region of the package substrate to which a cap is bonded. In one embodiment, the package bonding region is part of an upper portion of the package substrate. For example, the package bonding region is part of the top cavity. In some embodiments, the package bonding region is part of the top package surface and external cavity.

Multiple continuous sealing rings are provided on the package bonding region of the package substrate for sealing a cap to the package substrate. In one embodiment, at least first and second (two) continuous sealing rings are provided in the package bonding region. Providing more than 2 sealing rings may also be useful. The multiple continuous sealing rings improve the hermetic sealing of the cavity in which a die is disposed. The sealing rings, in one embodiment, are metal sealing rings. In one embodiment, the sealing rings are Fe—Ni—Co or Kovar® sealing rings. Other types of sealing rings may also be useful. It is understood that the sealing rings need not be formed of the same material. The sealing rings may be pre-formed by stamping, 3D printing or molding. Other techniques for forming the sealing rings may also be useful.

In one embodiment, a sealing ring is disposed or bonded on a package sealing region on the package substrate. For example, first and second package sealing regions are provided in the package bonding region on the package substrate for the first and second sealing rings. The first and second package sealing regions may be located on abutting surfaces of the package substrate in the package bonding region. In one embodiment, the package bonding region is part of the top cavity. For example, the first package sealing region is disposed on the top cavity bottom surface and the second package sealing region is disposed on the top cavity sidewalls. Other configurations of the package sealing regions may also be useful. The first and second sealing regions are metallized sealing regions which may be embedded into the package substrate during formation.

In one embodiment, the first and second sealing rings are bonded to the first and second sealing regions by brazing. Other techniques for bonding the sealing rings to the sealing regions may also be useful. In one embodiment, the sealing rings are brazed to the sealing regions one at a time. For example, the first or the second sealing ring is bonded the first or second sealing region by brazing followed by bonding the other sealing ring to the other sealing region by brazing. In other embodiments, the sealing rings are bonded to the sealing regions in a single brazing process.

A die is attached to a die attach region of the package substrate at 520. For example, a die is picked up by a die bonder and placed onto the die attach region of the package substrate. The die may be attached to the die attach region by, for example, an adhesive. The adhesive may be an adhesive tape disposed on the die attach region. A curing process may be performed to permanently attach the die to the die attach region. Wire bonds are formed to connect the die pads on the top surface of the die to package pads on the top surface of the package substrate. Prior to wire bonding, a plasma step may be performed to clean the surfaces of the package pads and die pads.

A curing process is performed to release gases and moisture out of the package at 530. For example, the package substrate with the die is baked to release gas and moisture out of the package. After curing, a cap is bonded to the package substrate to hermetically seal the die in the internal cavities at 540. The cap may be a metal cap. The metal cap may be a metal cap with a recess or a planar metal cap. Depending on the configuration, a non-conductive protective layer may be provided on the inner surface of the cap to prevent damaging the wire bonds In one embodiment, bonding the cap includes fitting the cap to the sealing rings on the package bonding region of the package substrate. In one embodiment, the sealing rings are fitted to the cap sealing regions of the cap. A seam sealing process is performed to bond the sealing rings to the cap sealing regions, creating a hermetically sealed cavity encasing the die. The seam sealing process, for example, is a welding process. The welding process, for example, includes applying current and voltage to weld the sealing rings to the cap sealing regions. Other types of seam sealing processes may also be useful.

As described, the process forms a single package. The process may be used to form multiple packages. For example, package substrates may be attached to a carrier, dies are attached to package substrates on the carrier, wiring bonding the dies to the package substrates and bonding caps to the package substrates. Thereafter, the packages may be removed from the carrier.

The inventive concept of the present disclosure may be embodied in other specific forms without departing from the spirit or essential characteristics thereof. The foregoing embodiments, therefore, are to be considered in all respects illustrative rather than limiting the invention described herein. Scope of the invention is thus indicated by the appended claims, rather than by the foregoing description, and all changes that come within the meaning and range of equivalency of the claims are intended to be embraced therein.

What is claimed is:

1. A hermetic package comprising:
 a package substrate having a top substrate surface and a bottom substrate surface, the package substrate comprises
  a bottom cavity having a bottom cavity bottom surface and bottom cavity sidewalls, wherein the bottom cavity is configured to accommodate a die within the bottom cavity,
  a top cavity disposed over the bottom cavity, wherein the top cavity comprises a larger footprint than the bottom cavity, the top cavity having a top cavity bottom surface at a top of the bottom cavity and top cavity sidewalls,
  a package bonding region, the package bonding region is a part of the top cavity, the package bonding region includes a first sealing region and a second sealing region,
  a first sealing ring bonded to the first sealing region disposed on a first surface of the top cavity, and
  a second sealing ring bonded to the second sealing region disposed on a second surface of the top cavity, wherein the first and second surfaces are different surfaces of the top cavity, the first and second sealing rings comprise solid metallic sealing rings;
 a die attach region disposed within the bottom cavity bottom surface, the die attach region comprises a footprint smaller than the bottom cavity bottom surface;
 a die with inactive and active die surfaces, wherein the inactive surface of the die is attached within the die attach region on the bottom cavity bottom surface, wherein the die includes die pads on the active die surface electrically coupled to package pads disposed on the package substrate;
 a cap with a cap bonding region having a first cap sealing region and a second cap sealing region, where the cap bonding region comprises seam bonds with the first and second sealing rings to create a hermetically sealed cavity for the die.

2. The package of claim 1 wherein:
 the cap comprises a planar cap having top and bottom major cap surfaces and cap side surfaces;
 the first cap sealing region is disposed at the periphery of the bottom major cap surface;
 the second cap sealing region is disposed at the cap side surfaces;
 the first sealing region is disposed on the top cavity bottom surface;
 the second sealing region is disposed on the top cavity sidewalls; and
 wherein the bottom major surface of the planar cap forms the hermetically sealed cavity with the bottom cavity with the die.

3. The package of claim 2 wherein:
 the package pads are disposed on the top cavity bottom surface inside of the first sealing region with the first sealing ring;
 wire bonds electrically connect the package pads to die pads; and
 wherein the first sealing ring provides sufficient height for the cap to accommodate the wire bonds.

4. The package of claim 3 wherein:
the cap comprises a metallic cap; and
the bottom major cap surface comprises an insulating layer to prevent shorting of the wire bonds.

5. The package of claim 1 wherein:
the cap comprises a recessed cap, the recessed cap includes
a planar member top and bottom major cap surfaces,
a leg member surrounding the planar member, the leg member includes inner, outer and bottom leg member surfaces,
a cap cavity defined by inner leg member surfaces and the bottom the bottom major cap surface;
the first cap sealing region is disposed on the bottom leg member surfaces;
the second cap sealing region is disposed on a lower portion of the outer leg member surfaces;
the first sealing region is disposed on the top cavity bottom surface;
the second sealing region is disposed on the top cavity sidewalls; and
wherein the planar member extends above the top cavity and the cap cavity forms the hermetically sealed cavity with the bottom cavity with the die.

6. The package of claim 5 wherein:
the package pads are disposed on the top cavity bottom surface inside of the first sealing region with the first sealing ring; and
wire bonds electrically connect the package pads to die pads.

7. The package of claim 6 wherein:
the cap comprises a metallic cap; and
the cap cavity provide sufficient space between the wire bonds and the metallic cap to prevent shorting.

8. The package of claim 6 wherein the cap comprises a metallic cap.

9. The package of claim 1 wherein the package substrate further includes an intermediate cavity disposed between the top cavity and the bottom cavity, the intermediate cavity comprises:
an intermediate cavity footprint which is larger than the footprint of the bottom cavity and smaller than the top cavity;
an intermediate bottom surface at the top of the bottom cavity sidewalls; and
intermediate cavity inner sidewalls abutting the top cavity bottom surface and intermediate bottom surface.

10. The package of claim 9 wherein:
the cap comprises a planar cap having top and bottom major cap surfaces and cap side surfaces;
the first cap sealing region is disposed at the periphery of the bottom major cap surface;
the second cap sealing region is disposed at the cap side surfaces;
the first sealing region is disposed on the top cavity bottom surface;
the second sealing region is disposed on top cavity sidewalls; and
wherein the bottom major surface of the planar cap forms the hermetically sealed cavity with the intermediate cavity and bottom cavity with the die.

11. The package of claim 10 wherein:
the package pads are disposed on the intermediate cavity bottom surface;
wire bonds electrically connect the package pads to die pads; and
wherein the intermediate cavity provides sufficient height for the cap to accommodate the wire bonds without shorting.

12. The package of claim 11 wherein the cap comprises a metallic cap.

13. The package of claim 9 wherein:
the cap comprises a recessed cap, the recessed cap includes
a planar member top and bottom major cap surfaces,
a leg member surrounding the planar member, the leg member includes inner, outer and bottom leg member surfaces,
a cap cavity defined by inner leg member surfaces and the bottom the bottom major cap surface;
the first cap sealing region is disposed on the bottom leg member surfaces;
the second cap sealing region is disposed on a lower portion of the outer leg member surfaces;
the first sealing region is disposed on the top cavity bottom surface;
the second sealing region is disposed on the top cavity sidewalls; and
wherein the planar member extends above the top cavity and the cap cavity forms the hermetically sealed cavity with the intermediate cavity and bottom cavity with the die.

14. The package of claim 13 wherein:
the package pads are disposed on the intermediate bottom cavity surface; and
wire bonds electrically connect the package pads to die pads.

15. The package of claim 1 wherein the top cavity comprises:
a top cavity top surface abutting the top cavity sidewalls;
top cavity outer sidewalls abutting the top cavity top surface; and
a top cavity outer bottom surface abutting a bottom of the top cavity outer sidewalls.

16. The package of claim 15 wherein:
the cap comprises a recessed cap, the recessed cap includes
a planar member top and bottom major cap surfaces,
a leg member surrounding the planar member, the leg member includes inner, outer and bottom leg member surfaces,
a cap cavity defined by inner leg member surfaces and the bottom the bottom major cap surface;
the first cap sealing region is disposed on the bottom leg member surfaces;
the second cap sealing region is disposed on a periphery of the bottom major surface adjacent to the leg member;
the first sealing region is disposed on the top cavity outer bottom surface; and
the second sealing region is disposed on the top cavity top surface.

17. The package of claim 15 further comprises outer top cavity inner sidewalls abutting the top cavity outer bottom surface, wherein the outer top cavity inner sidewalls, the top cavity outer bottom surface and the top cavity outer sidewalls form an outer top cavity.

18. The package of claim 17 wherein:
the cap comprises a recessed cap, the recessed cap includes
a planar member top and bottom major cap surfaces, a leg member surrounding the planar member, the leg member includes inner, outer and bottom leg member surfaces,
a cap cavity defined by inner leg member surfaces and the bottom the bottom major cap surface;
the first cap sealing region is disposed on the bottom leg member surfaces;
the second cap sealing region is disposed on a periphery of the bottom major surface adjacent to the leg member;
the first sealing region is disposed on the top cavity outer bottom surface; and
the second sealing region is disposed on the top cavity top surface.

19. A package substrate of a package comprising a substrate body having a top substrate surface and a bottom substrate surface, the substrate body comprises:
a cavity with
a bottom cavity having a bottom cavity bottom surface and bottom cavity sidewalls,
a die attach region disposed within the bottom cavity bottom surface, the die attach region comprises a footprint smaller than the bottom cavity bottom surface, wherein when a die is attached to the die attach region, die sidewalls of the die are spaced apart from the bottom cavity sidewalls,
a top cavity disposed over the bottom cavity, wherein the top cavity comprises a larger footprint than the bottom cavity, the top cavity having a top cavity bottom surface at a top of the bottom cavity and top cavity sidewalls;
package pads disposed in the cavity, wherein the package pads are configured to electrically connect to a die when bonded to the die attach region;
a package bonding region, the package bonding region is a part of the top cavity, the package bonding region includes a first sealing region on a first surface of the top cavity and a second sealing region on a second surface, wherein the first and second surfaces are different surfaces of the top cavity, wherein
a first sealing ring is bonded to the first sealing region on the first surface,
a second sealing ring is bonded to the second sealing region on the second surface, the first and second sealing ring comprise solid metallic sealing rings, wherein the first and second sealing rings are configured to form a seam bond with a cap to create a hermetically sealed cavity.

20. The package substrate of claim 19 further comprises an intermediate cavity between the top and bottom cavities, wherein the intermediate cavity comprises:
an intermediate bottom surface at the top of the bottom cavity sidewalls; and
intermediate cavity inner sidewalls abutting the top cavity bottom surface and intermediate bottom surface.

21. The package substrate of claim 19 wherein the top cavity comprises:
a top cavity top surface abutting the top cavity sidewalls;
top cavity outer sidewalls abutting the top cavity top surface; and
a top cavity outer bottom surface abutting a bottom of the top cavity outer sidewalls.

22. The package substrate of claim 21 further comprises outer top cavity inner sidewalls abutting the top cavity outer bottom surface, wherein the outer top cavity inner sidewalls, the top cavity outer bottom surface and the top cavity outer sidewalls form an outer top cavity.

23. The package substrate of claim 19 wherein:
the first surface of the first bonding region comprises the top cavity bottom surface; and
the second surface of the second bonding region comprises the top cavity sidewalls.

* * * * *